(12) United States Patent
Yoshida et al.

(10) Patent No.: US 9,349,574 B2
(45) Date of Patent: May 24, 2016

(54) PLASMA ETCHING METHOD AND PLASMA ETCHING APPARATUS

(71) Applicant: Tokyo Electron Limited, Tokyo (JP)

(72) Inventors: Ryoichi Yoshida, Miyagi (JP); Takayuki Ishii, Miyagi (JP); Ken Kobayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/414,946

(22) PCT Filed: Aug. 5, 2013

(86) PCT No.: PCT/JP2013/071129
§ 371 (c)(1),
(2) Date: Jan. 15, 2015

(87) PCT Pub. No.: WO2014/024833
PCT Pub. Date: Feb. 13, 2014

(65) Prior Publication Data
US 2015/0206715 A1 Jul. 23, 2015

Related U.S. Application Data

(60) Provisional application No. 61/693,391, filed on Aug. 27, 2012.

(30) Foreign Application Priority Data

Aug. 9, 2012 (JP) .................................. 2012-177053

(51) Int. Cl.
*C03C 15/00* (2006.01)
*H01J 37/32* (2006.01)
(Continued)

(52) U.S. Cl.
CPC ....... *H01J 37/32082* (2013.01); *H01J 37/3266* (2013.01); *H01J 37/32449* (2013.01);
(Continued)

(58) Field of Classification Search
CPC ............ H01L 21/312; H01L 21/31116; H01L 21/31144; H01J 37/3266; H01J 37/2237
USPC ............................ 216/37, 41, 67; 156/345.23
See application file for complete search history.

(56) References Cited

U.S. PATENT DOCUMENTS 6,686,296 B1 * 2/2004 Costrini et al. ............... 438/725
2005/0103748 A1 * 5/2005 Yamaguchi et al. ............ 216/67

FOREIGN PATENT DOCUMENTS

JP       07-106308 A      4/1995
JP       2003-163349 A    6/2003
(Continued)

OTHER PUBLICATIONS

International Search Report for PCT/JP2013/071129 dated Oct. 29, 2013.

*Primary Examiner* — Duy Deo
*Assistant Examiner* — Maki Angadi
(74) *Attorney, Agent, or Firm* — Pearne & Gordon LLP

(57) ABSTRACT

A plasma etching method includes a plasma process of plasma-processing a surface of a photoresist, which has a predetermined pattern with plasma generated from a hydrogen-containing gas. Further, the plasma etching method includes an etching process of etching a silicon-containing film with plasma generated from a CF-based gas and a gas containing a CHF-based gas by using the plasma-processed photoresist as a mask. Furthermore, in the plasma etching method, the plasma process and the etching process are repeated at least two or more times.

8 Claims, 22 Drawing Sheets

(51) Int. Cl.
*H01L 21/027* (2006.01)
*H01L 21/311* (2006.01)

(52) U.S. Cl.
CPC ..... *H01J 37/32669* (2013.01); *H01J 37/32688* (2013.01); *H01L 21/0273* (2013.01); *H01L 21/31116* (2013.01); *H01L 21/31144* (2013.01); *H01J 2237/334* (2013.01)

(56) References Cited

FOREIGN PATENT DOCUMENTS

| | | |
|---|---|---|
| JP | 2006-302924 A | 11/2006 |
| WO | 2004/003988 A1 | 1/2004 |

* cited by examiner

FIG. 8

| | INITIAL | H2/Ar CURE | | WO CURE |
| --- | --- | --- | --- | --- |
| | | POST CURE | POST BREAKTHROUGH | |
| CROSS SECTION | | | | |
| MASK HEIGHT | 56.5nm | 58.0nm | 25.0nm | 30.0nm |
| TOP/BTM CD | 54.2/48.9nm | 58.6/52.2nm | 40.0/34.4nm | 32.8/27.0nm |
| TOP SURFACE | | | | |
| SWR/LER(L)/LER(R) | 3.7(MAX4.3~MIN3.0)/3.5/3.5 | 3.4(MAX3.9~MIN3.1)/2.3/2.2 | 2.9(MAX3.7~MIN2.3)/2.3/2.1 | 2.8(MAX3.0~MIN2.6)/2.8/2.4 |
| SUM | 10.7 | 7.9 | 7.3 | 8.0 |

FIG. 10

| | H₂/Ar | H₂/N₂ | HBr | N₂ |
|---|---|---|---|---|
| CROSS SECTION | | | | |
| MASK HEIGHT | 57.0nm | 48.0nm | 45.0nm | 57.0nm |
| TOP/BTM CD | 59.0/55.6nm | 65.2/54.6nm | 64.6/47.2nm | 65.4/46.2nm |
| TOP SURFACE | | | | |
| SWR/LER(L)/LER(R) | 2.5(MAX3.4~MIN1.6)/ 1.6/1.9 | 2.7(MAX3.5~MIN2.0)/ 2.0/2.2 | 3.4(MAX3.8~MIN2.2)/ 3.1/2.6 | 2.4(MAX2.5~MIN2.1)/ 2.3/2.2 |
| SUM | 6.0 | 6.9 | 9.1 | 6.9 |

FIG. 13

| | BASELINE (15sec) | 30sec | 45sec |
|---|---|---|---|
| CROSS SECTION | | | |
| MASK HEIGHT | 58.0nm | 57.0nm | 59.0nm |
| TOP/BTM CD | 58.6/55.2nm | 59.0/55.6nm | 61.6/55.0nm |
| TOP SURFACE | | | |
| SWR/LER(L)/ LER(R) | 3.4(MAX3.9~MIN3.1)/ 2.3/2.2 | 2.5(MAX3.4~MIN1.6)/ 1.6/1.9 | 2.4(MAX2.7~MIN2.2)/ 2.0/1.9 |
| SUM | 7.9 | 6.0 | 6.3 |

FIG. 15

| | [CURE +BT]×1<br>(CURE=30s, BT=30s) | [CURE +BT]×2<br>(CURE=60s, BT=30s) | [CURE +BT]×3<br>(CURE=60s, BT=30s) |
|---|---|---|---|
| CROSS SECTION | | | |
| MASK HEIGHT | 34.0nm | 34.0nm | 34.0nm |
| TOP/BTM CD | 40.8/34.0nm | 37.6/29.8nm | 43.8/37.2nm |
| TOP SURFACE | | | |
| SWR/LER(L)/<br>LER(R) | 2.4(MAX2.9~MIN1.8)/<br>2.3/2.3 | 2.6(MAX2.8~MIN2.4)/<br>2.2/2.1 | 2.4(MAX3.0~MIN2.1)/<br>2.0/1.9 |
| SUM | 7.0 | 6.9 | 6.3 |

FIG. 17

| | CURE (ET=30sec) | [CURE+BT]×1 (CURE=30s,BT=60s) | [CURE+BT]×3 (CURE=60s,BT=60s) |
|---|---|---|---|
| CROSS SECTION | | | |
| MASK HEIGHT | 56.0nm | 28.0nm | 33.0nm |
| TOP/BTM CD | 64.8/56.0nm | 40.8/35.0nm | 38.8/35.4nm |
| TOP SURFACE | | | |
| SWR/LER(L)/LER(R) | 2.2(MAX2.4~MIN1.6)/1.4/1.7 | 2.1(MAX2.6~MIN1.6)/2.2/2.0 | 2.2(MAX2.5~MIN1.7)/1.4/1.8 |
| SUM | 5.3 | 6.3 | 5.4 |

FIG. 19

| TOP SURFACE | CURE (ET=30sec) | [CURE +BT]x1 (=30s,BT=56s) | [CURE +BT]x4 (=54s,BT=58s) |
|---|---|---|---|
| SWR/LER(L)/ LER(R) | 2.2(MAX2.7~MIN1.7)/ 1.4/1.2 | 2.5(MAX3.2~MIN2.1)/ 2.3/1.9 | 2.3(MAX2.5~MIN1.9)/ 1.8/1.9 |
| SUM | 4.8 | 6.7 | 6.0 |

FIG. 21

| | CURE (ET=30sec) | [CURE+BT]×1 (CURE=30s,BT=30s) | [CURE+BT]×3 (CURE=60s,BT=30s) | [CURE+BT]×6 (CURE=60s,BT=30s) |
|---|---|---|---|---|
| CROSS SECTION | | | | |
| MASK HEIGHT | 57.0nm | 34.0nm | 34.0nm | 37.0nm |
| TOP/BTM CD | 59.0/55.6nm | 40.8/34.0nm | 43.8/37.2nm | 40.6/38.4nm |
| TOP SURFACE | | | | |
| SWR/LER(L)/ LER(R) | 2.5(MAX3.4~MIN1.6)/ 1.6/1.9 | 2.4(MAX2.9~MIN1.8)/ 2.3/2.3 | 2.4(MAX3.0~MIN2.1)/ 2.0/1.9 | 2.9(MAX3.0~MIN2.5)/ 2.3/2.2 |
| SUM | 6.0 | 7.0 | 6.3 | 7.4 |

PLASMA ETCHING METHOD AND PLASMA ETCHING APPARATUS

CROSS-REFERENCE TO RELATED APPLICATION

This Application is a U.S. national phase application under 35 U.S.C. §371 of PCT Application No. PCT/JP2013/071129 filed on Aug. 5, 2013, which claims the benefit of Japanese Patent Application No. 2012-177053 filed on Aug. 9, 2012, and U.S. Provisional Application Ser. No. 61/693,391 filed on Aug. 27, 2012, the entire disclosures of which are incorporated herein by reference.

TECHNICAL FIELD

The embodiments described herein pertain generally to a plasma etching method and a plasma etching apparatus.

BACKGROUND

Conventionally, there is a technology of etching a SiON film with a resist mask. For example, there is a technology of etching a SiON film with a fluorine-containing gas (including a $CHF_3$ gas). Further, for example, there is a technology of etching a SiON film by using a $H_2$ gas as an etching gas.

Patent Document 1: Japanese Patent Laid-open Publication No. 2003-163349
Patent Document 2: Japanese Patent Laid-open Publication No. H07-106308

DISCLOSURE OF THE INVENTION

Problems to be Solved by the Invention

However, in the above-described conventional technologies, there is a problem that a roughness of a resist mask is transcribed to a SiON film as an underlayer thereof by an etching process, so that a line to be formed becomes rough. By way of example, a width of the line to be formed by the etching process may be non-uniform, or an edge of the line to be formed by the etching process may be non-uniform.

Means for Solving the Problems

In one example embodiment, a plasma etching method includes a plasma process of plasma-processing a surface of a photoresist, which has a predetermined pattern and is formed on a target object, with plasma generated from a hydrogen-containing gas; and an etching process of etching a silicon-containing film with plasma generated from a CF-based gas and a gas containing a CHF-based gas by using the plasma-processed photoresist as a mask.

Effect of the Invention

In accordance with the example embodiment, the etching apparatus has an effect of reducing a roughness of a line to be formed by the etching process.

BRIEF DESCRIPTION OF THE DRAWINGS

FIG. 8 is a diagram illustrating a difference between a case where an etching process is performed after a plasma process in accordance with the first example embodiment and a case where the etching process is performed without performing the plasma process.

FIG. 10 is a diagram illustrating an effect depending on a kind of a hydrogen-containing gas used in the plasma process in accordance with the first example embodiment.

FIG. 13 is a diagram illustrating a relationship between a time period during which the plasma process is performed and a roughness of a photoresist in accordance with the first example embodiment.

FIG. 15 is a diagram illustrating a case where the plasma process and the etching process are repeated two or more times in accordance with the first example embodiment.

FIG. 17 is a diagram illustrating a case where a plasma process and an etching process are repeated two or more times in accordance with the first example embodiment.

FIG. 19 is a diagram illustrating a case where a plasma process and an etching process are repeated two or more times in accordance with the first example embodiment.

FIG. 21 is a diagram illustrating a case where a plasma process and an etching process are repeated two or more times in accordance with the first example embodiment.

MODE FOR CARRYING OUT THE INVENTION

Hereinafter, an example embodiment of an etching apparatus and an etching method will be explained in detail with reference to the accompanying drawings. Further, the present example embodiment does not limit the disclosure to be described herein. Example embodiments can be combined as appropriate within a range where the content of the process is not contradicted.

A plasma etching method includes a plasma process of plasma-processing a surface of a photoresist, which has a preset pattern and is formed on a target object, with plasma generated from a hydrogen-containing gas; and an etching process of etching a silicon-containing film with plasma generated from a CF-based gas and a gas containing a CHF-based gas by using the plasma-processed photoresist as a mask.

The plasma process and the etching process may be repeated at least two or more times.

The plasma process and the etching process may be repeated at least two or more times, and a processing time of the plasma process performed for a first time may be longer than a processing time of the plasma process performed for a second time or later.

The hydrogen-containing gas may contain at least one of a $H_2$ gas, a $H_2/Ar$ gas, a HBr gas, a $H_2/N_2$ gas, a $N_2$ gas, and a $H_2/N_2/CH_4$ gas.

The CF-based gas may be a $CF_4$ gas and the gas containing the CHF-based gas may be a $CHF_3$ gas.

Each of the plasma process and the etching process may be performed for a preset time or more.

The plasma process may be performed at a lower pressure than the etching process.

The plasma process may be performed at a higher temperature of the target object than the etching process.

A plasma etching apparatus includes a chamber configured to perform a plasma etching process to a target object; an exhaust unit configured to decompress an inside of the chamber; a gas supply unit configured to supply a processing gas into the chamber; and a control unit configured to control such that a surface of a photoresist formed on the target object is plasma-processed with plasma generated from a hydrogen-containing gas and then a silicon-containing film on the target object is etched with a CF-based gas and a gas containing a CHF-based gas by using the plasma-processed photoresist as a mask.

Etching Apparatus in Accordance with First Example Embodiment

Figure 1:
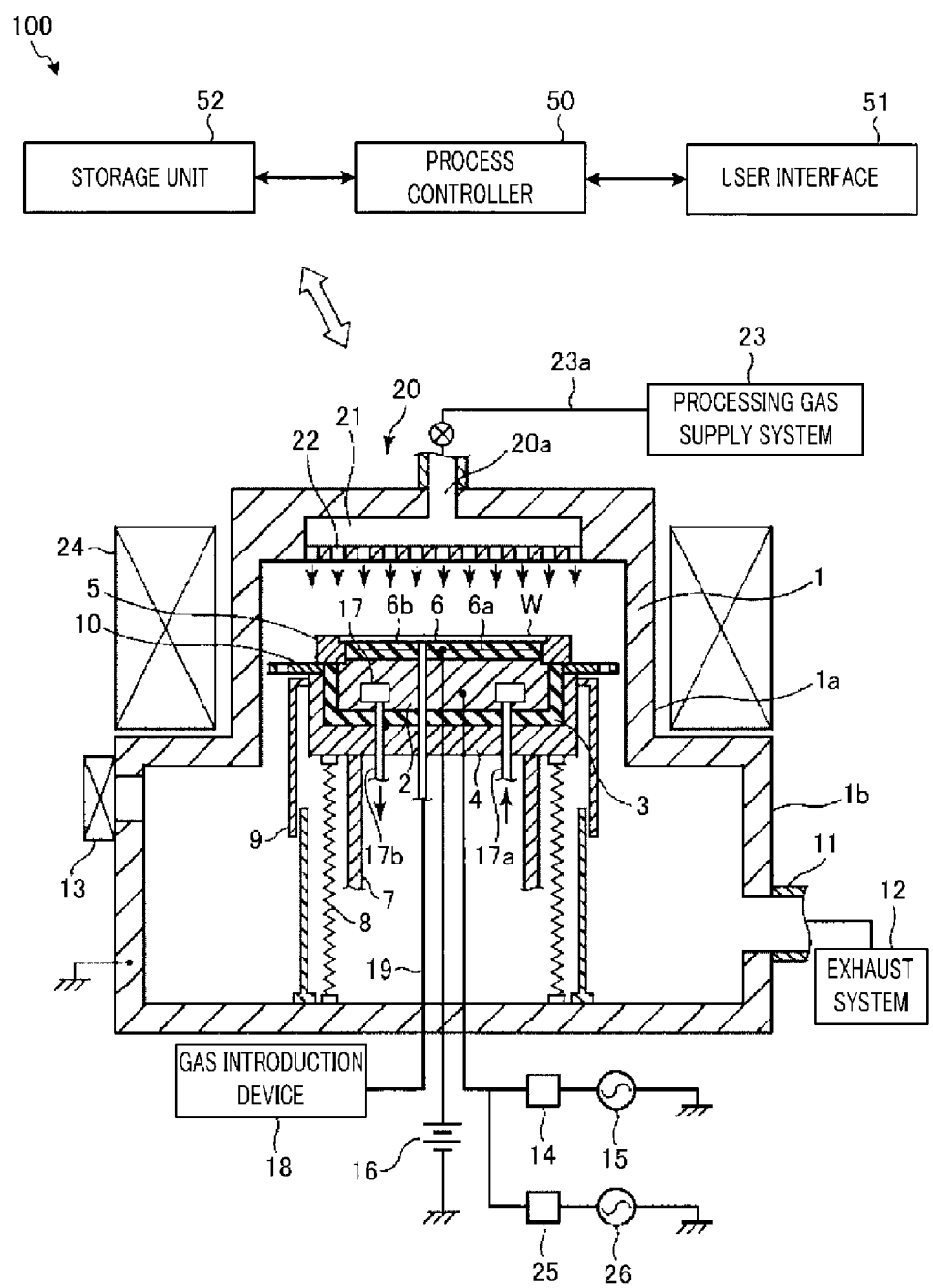
FIG. 1 is a cross-sectional view illustrating an example of a plasma etching apparatus in accordance with a first example embodiment.

FIG. 1 is a cross-sectional view illustrating an example of a plasma etching apparatus in accordance with a first example embodiment. In the example depicted in FIG. 1, a parallel plate-type plasma etching apparatus is illustrated as a plasma etching apparatus 100. As depicted in FIG. 1, the plasma etching apparatus 100 includes a chamber (processing container) 1. The chamber (processing container) 1 is airtightly sealed and formed into a cylindrical step shape including an upper part 1a having a smaller diameter and a lower part 1b having a larger diameter, and a wall member thereof is made of, for example, aluminum.

Within the chamber 1, there is provided a supporting table 2 configured to horizontally support a wafer W serving as a target object. The supporting table 2 is made of, for example, aluminum and supported on a conductive supporting member 4 via an insulating plate 3. Further, on an outer periphery of an upper portion of the supporting table 2, there is provided a focus ring 5 made of, for example, Si. The supporting table 2 and the supporting member 4 are configured to be moved up and down by a ball screw device including a ball screw 7. A driving unit at a lower portion of the supporting member 4 is covered by a bellows 8 made of stainless steel (SUS). A bellows cover 9 is provided outside the bellows 8. Further, a baffle plate 10 is provided outside the focus ring 5, and the focus ring 5 is electrically connected with the chamber 1 through the baffle plate 10, the supporting member 4, and the bellows 8. The chamber 1 is grounded.

At a sidewall of the lower part 1b of the chamber 1, an exhaust port 11 is formed. The exhaust port 11 is connected with an exhaust system 12. The inside of the chamber 1 is configured to be decompressed to a preset vacuum level by operating a vacuum pump of the exhaust system 12. Meanwhile, at an upper sidewall of the lower part 1b of the chamber 1, there is provided a gate valve 13 configured to open and close a loading/unloading opening for the wafer W. The exhaust system 12 can also be referred to as "decompressing unit".

The supporting table 2 is connected with a first high frequency power supply 15 for plasma generation via a matching unit 14, and the first high frequency power supply 15 is configured to apply a high frequency power having a preset frequency to the supporting table 2. Above the supporting table 2, a shower head 20 to be described later is provided to face the supporting table 2 in parallel with each other. The shower head 20 is grounded. The supporting table 2 and the shower head 20 serve as a pair of electrodes.

A power supply line of the first high frequency power supply 15 is connected with a second high frequency power supply 26 via a matching unit 25. The second high frequency power supply 26 is configured to apply a high frequency power having a lower frequency than the frequency of the first high frequency power supply 15 to be overlapped with the high frequency power for plasma generation.

On a surface of the supporting table 2, there is provided an electrostatic chuck 6 configured to electrostatically attract and hold the wafer W. The electrostatic chuck 6 has an electrode 6a interposed between insulators 6b. The electrode 6a is connected with a DC power supply 16. Further, by applying a voltage from the DC power supply 16 to the electrode 6a, the wafer W is attracted by an electrostatic force, for example, Coulomb force.

Within the supporting table 2, a coolant path 17 is provided. A coolant is circulated by being introduced into the coolant path 17 through a coolant inlet line 17a and discharged through a coolant outlet line 17b, so that cold heat thereof is transferred to the wafer W via the supporting table 2. Thus, a target surface of the wafer W can be controlled to have a desired temperature.

Further, a cooling gas is introduced into a gap between an upper surface of the electrostatic chuck 6 and a rear surface of the wafer W by a gas introduction device 18 through a gas supply line 19. As a result, the wafer W can be effectively cooled with the coolant circulated in the coolant path 17 even if the chamber 1 is exhausted by the exhaust system 12 and maintained in a vacuum state. Since the cooling gas is introduced as such, the cold heat of the coolant is effectively transferred to the wafer W, and cooling efficiency of the wafer W can be improved. The cooling gas may include, for example, He or the like.

The shower head 20 is provided at a ceiling portion of the chamber 1 to face the supporting table 2. The shower head 20 includes multiple gas discharge holes 22 at a lower surface thereof and a gas introduction opening 20a at an upper surface thereof. Further, within the shower head 20, a space 21 is formed. The gas introduction opening 20a is connected with a gas supply line 23a, and the other end of the gas supply line 23a is connected with a processing gas supply system 23 configured to supply a processing gas including an etching gas and a dilution gas. The processing gas supply system 23 can also be referred to as "gas supply unit".

Such a processing gas is introduced into the space 21 of the shower head 20 from the processing gas supply system 23 through the gas supply line 23a and the gas introduction opening 20a, and is discharged through the gas discharge holes 22.

Around the upper part 1a of the chamber 1, a multi-pole magnet 24 is arranged concentrically and configured to form a magnetic field around a processing space between the supporting table 2 and the shower head 20. The multi-pole magnet 24 is configured to be rotated by a non-illustrated rotation device.

Figure 2:
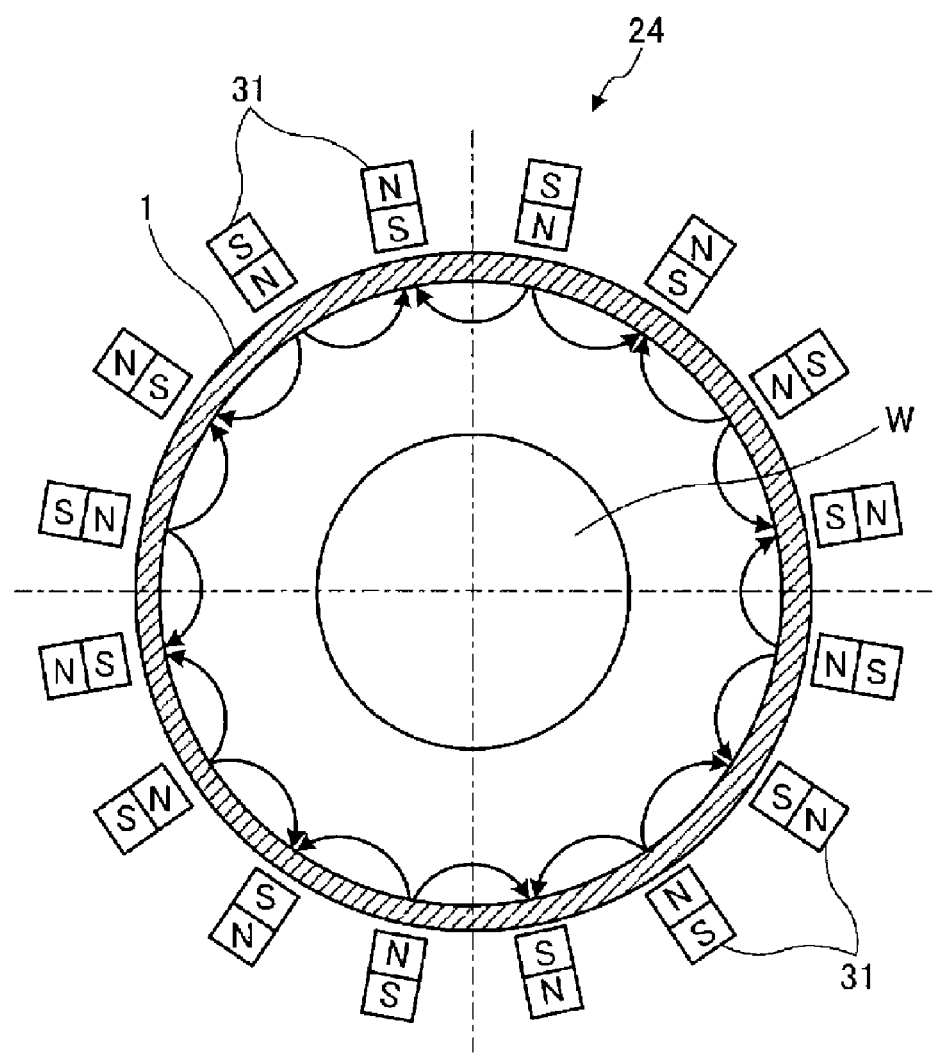
FIG. 2 is a horizontal cross sectional view schematically illustrating a multi-pole magnet arranged around a chamber of the plasma etching apparatus in accordance with the first example embodiment.

FIG. 2 is a horizontal cross sectional view schematically illustrating the multi-pole magnet arranged around the chamber of the plasma etching apparatus in accordance with the first example embodiment. As depicted in the horizontal cross sectional view of FIG. 2, the multi-pole magnet 24 has a configuration in which multiple segment magnets 31 formed of permanent magnets are supported by a non-illustrated supporting member to be arranged in a ring shape. In this example, 16 segment magnets 31 are arranged in a ring shape (concentric circular shape) under a multi-pole state. That is, in the multi-pole magnet 24, the multiple adjacent segment magnets 31 are arranged in such a manner that magnetic pole directions thereof are opposite to each other, so that magnetic force lines are formed between the adjacent segment magnets 31 as depicted in the drawing. Further, a magnetic field of, for example, 0.02 T to 0.2 T (200 Gauss to 2000 Gauss), desirably 0.03 T to 0.045 T (300 Gauss to 450 Gauss) is formed only around a peripheral portion of the processing space and a portion where a wafer is placed is in a substantially non-magnetic field state. The reason why intensity of the magnetic field is determined as described above is because if the magnetic field is too strong, leakage magnetic field may be caused, and if the magnetic field is too weak, a plasma confining effect cannot be achieved. A suitable intensity of the magnetic field also depends on a configuration of the apparatus or the like, so that a range thereof may be different from respective apparatuses. Further, the substantially non-magnetic field state in the portion where a wafer is placed includes a state in which a magnetic field completely does not exist, a state in which there is no magnetic field affecting the etching process in the portion where a wafer is placed, and a state in which there is a magnetic field not substantially affecting the wafer process. FIG. 2 is a horizontal cross sectional view schematically illustrating the multi-pole magnet 24 arranged around the chamber of the apparatus depicted in FIG. 1.

In FIG. 2, a magnetic field having a magnetic flux density of, for example, 420 μT (4.2 Gauss) or less is applied to a peripheral portion of the wafer, so that the plasma confining effect can be achieved.

Figure 3A:
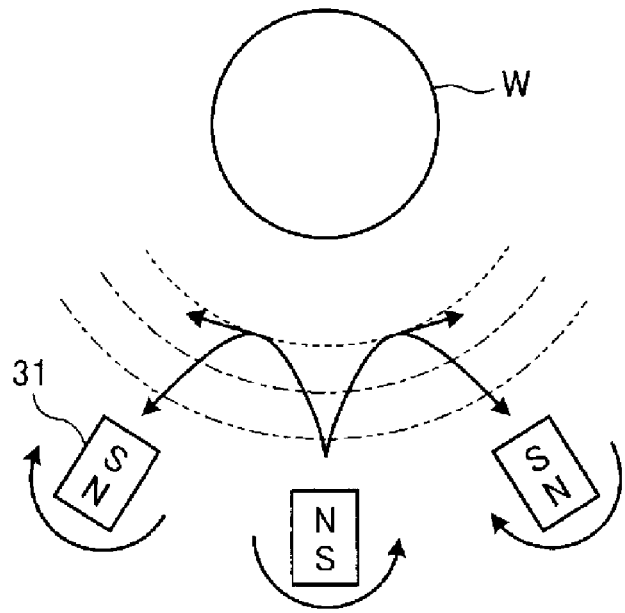
FIG. 3A to FIG. 3C are diagrams provided to explain a rotating operation of segment magnets of the plasma etching apparatus in accordance with the first example embodiment and a change in a magnetic field at that time.
Figure 3B:
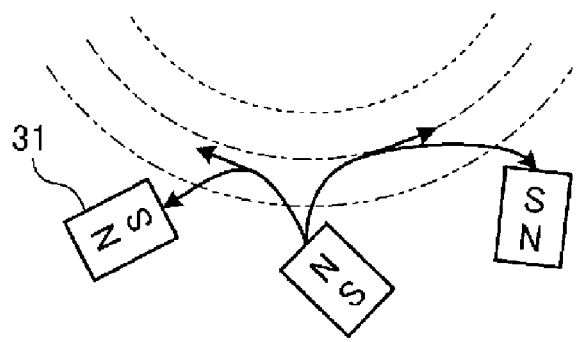
Figure 3C:
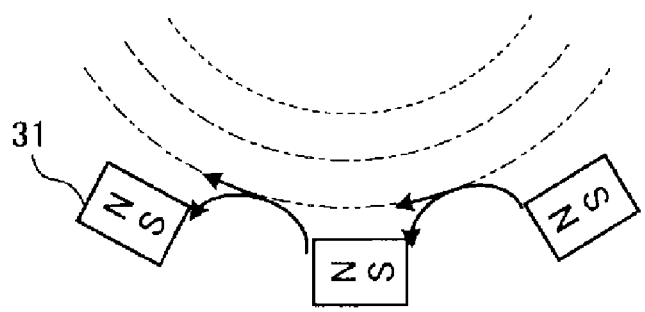

FIG. 3A to FIG. 3C are diagrams provided to explain a rotating operation of the segment magnets of the plasma etching apparatus in accordance with the first example embodiment and a change in a magnetic field at that time. Each of the segment magnets 31 is configured to be rotated around a vertical axis thereof by a non-illustrated segment magnet rotation device. As depicted in FIG. 2 and FIG. 3A, from a state in which the magnetic poles of the segment magnets 31 are oriented toward the chamber 1, the adjacent segment magnets 31 are synchronously rotated in opposite directions with each other as shown in FIG. 3B and FIG. 3C. Therefore, every other segment magnet 31 is rotated in the same direction. Further, FIG. 3B shows a state in which the segment magnets 31 are rotated by 45 degrees, and FIG. 3C shows a state in which the segment magnets 31 are rotated by 90 degrees. Since the segment magnets 31 are rotated as such, a state in which a multi-pole magnetic field is substantially formed and a state in which a multi-pole magnetic field is substantially not formed can be switched. A multi-pole magnetic field may be effective or may not be effective depending on a kind of an etching target film. Since the state in which a multi-pole magnetic field is formed and the state in which a multi-pole magnetic field is not formed can be switched, it is possible to select an appropriate etching condition on the etching target film.

Further, each of components of the plasma etching apparatus 100 is connected to a process controller 50 including a CPU to be controlled. The process controller 50 is connected with a user interface 51 including a keyboard used for a process manager to input commands for managing the plasma etching apparatus 100 and a display used for visualizing and displaying an operational status of the plasma processing apparatus 100.

Furthermore, the process controller 50 is connected to a storage unit 52 that stores recipes including control programs to implement various processes to be performed in the plasma etching apparatus 100 under the control of the process controller 50 or processing condition data.

Moreover, a preset recipe may be retrieved from the storage unit 52 in response to an instruction from the user interface 51, and the process controller 50 may be operated, so that a desired process may be performed in the plasma etching apparatus 100 under the control of the process controller 50. Recipes may be stored in a computer-readable storage medium such as a CD-ROM, a hard disk, a flexible disk, a flash memory, etc., or may be frequently transmitted from another apparatus via, e.g., a dedicated line. The process controller 50 can also be referred to as "control unit".

By way of example, the process controller 50 controls the respective components of the plasma etching apparatus 100 to perform a plasma etching method to be described later. As a more specific example, under the control of the process controller 50, a surface of a photoresist formed on a target object is plasma-processed with plasma generated from a hydrogen-containing gas, and then, a silicon-containing film of the target object is etched with plasma generated from a CF-based gas and a gas containing a CHF-based gas by using the plasma-processed photoresist as a mask. Details of the plasma etching method will be explained later. Herein, the target object is, for example, the wafer W. Further, the silicon-containing film includes, for example, a SiON film.

Figure 4:
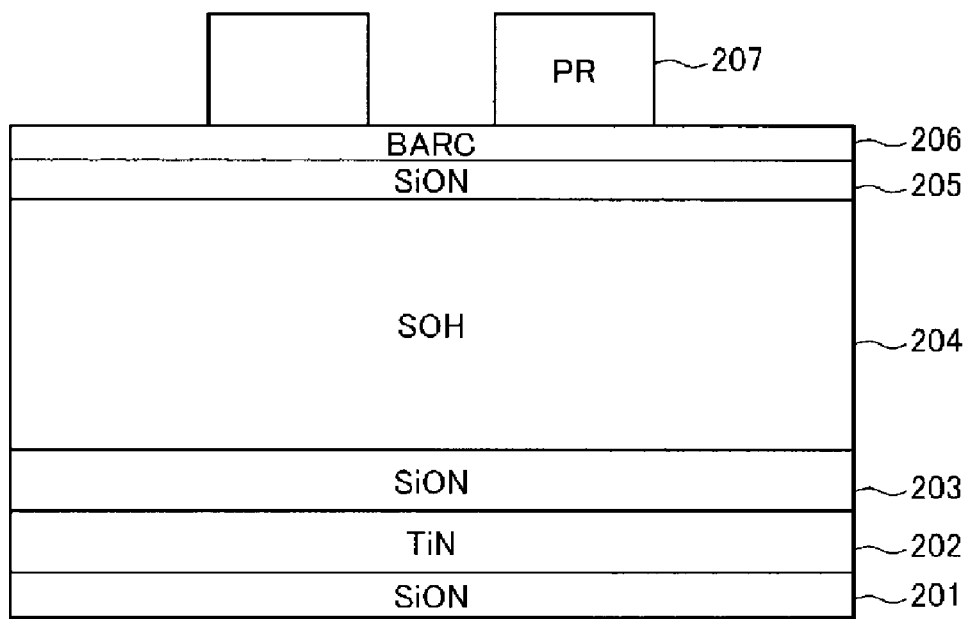
FIG. 4 is a cross-sectional view illustrating an example of a structure of a target object in accordance with the first example embodiment.

FIG. 4 is a cross-sectional view illustrating an example of a structure of the target object in accordance with the first example embodiment. As depicted in FIG. 4, in the target object, for example, SiON (Silicon OxyNitride) 201, TiN (Titanium Nitride) 202, SiON 203, SOH 204, SiON 205, and BARC 206 are stacked, and a PR (photoresist) 207 having a preset pattern is formed on the BARC 206. Further, the structure depicted in FIG. 4 is one example.

(Plasma Etching Method)

In the plasma etching method in accordance with the first example embodiment, a silicon-containing film is plasma-etched by using a photoresist having a preset pattern as a mask.

By way of example, the gate valve 13 is opened, and the wafer W serving as the target object is loaded into the chamber 1 to be mounted on the supporting table 2, and the supporting table 2 is moved up to a position as illustrated in the drawing. The inside of the chamber 1 is exhausted by the vacuum pump of the exhaust system 12 via the exhaust port 11.

Further, for example, the processing gas including the etching gas and the dilution gas is supplied at a preset flow rate from the processing gas supply system 23 into the chamber 1, and the inside of the chamber 1 is set to a preset pressure. In that state, the first high frequency power supply 15 applies a preset high frequency power to the supporting table 2. Herein, the wafer W is attracted and held on the electrostatic chuck 6 by a Coulomb force since a preset voltage is applied from the DC power supply 16 to the electrode 6a of the electrostatic chuck 6. Further, a high frequency electric field is formed between the shower head 20 as an upper electrode and the supporting table 2 as a lower electrode. Thus, the processing gas supplied into the processing space is excited into plasma, and as explained in detail below, a silicon-containing film is plasma-etched by using a photoresist having a preset pattern as a mask.

Further, herein, the magnetic field as depicted in FIG. 2 is formed around the processing space by the multi-pole magnet 24, so that the plasma confining effect can be achieved and an etching rate of the wafer W can be uniform.

Furthermore, a frequency and an output of a high frequency power from the first high frequency power supply 15 for plasma generation are appropriately set to generate plasma as desired. In order to increase a plasma density right above the wafer W, desirably, the frequency is set to be 40 MHz or more. Further, the second high frequency power supply 26 applies a high frequency power to control ion energy of plasma, and desirably, a frequency thereof is lower than the frequency of the first high frequency power supply 15 and equal to or higher than 3.2 MHz.

Moreover, in order to improve an etching shape, it is effective to adjust a temperature of the wafer W. For this reason, the coolant path 17 is provided, and the coolant is circulated through the coolant path 17, so that the cold heat thereof is transferred to the wafer W via the supporting table 2. Thus, the target surface of the wafer W is controlled to have a desired temperature. In order to improve the etching shape, i.e., anisotropy, the temperature of the wafer W is adjusted in a range of, for example, from 30° C. to 90° C.

Further, by selecting kinds of gases used when performing the plasma etching process and a flow rate ratio thereof, it is possible to improve uniformity in the etching shape. Furthermore, as a desirable range of other processing conditions, a gas pressure within the chamber 1 is 0.13 Pa to 6.67 Pa (1 mTorr to 50 mTorr), a frequency of the first high frequency power supply 15 is 100 MHz and a frequency of the second high frequency power supply 26 is 13 MHz, and the intensity of the magnetic field formed by the multi-pole magnet 24 in the processing space is 5.6 μT to 45.4 μT (56 G to 454 G). By employing such conditions, it is possible to uniformize the etching shape of the wafer W regardless of a difference in the mask pattern density.

Figure 5:
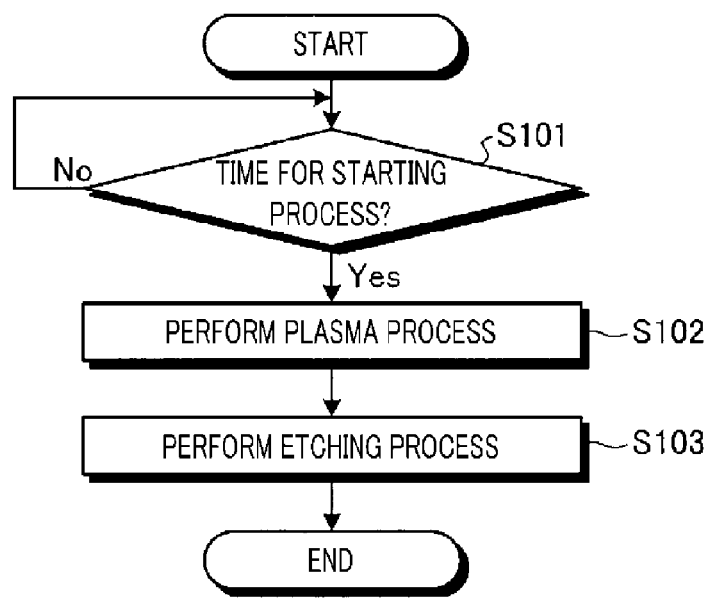
FIG. 5 is a diagram illustrating an example of a flowchart of a plasma etching method in accordance with the first example embodiment.

The plasma etching method in accordance with the first example embodiment will be explained in more detail. FIG. 5 is a diagram illustrating an example of a flowchart of the plasma etching method in accordance with the first example embodiment. As depicted in FIG. 5, when it is time to start a process (process S101), for example, a wafer W serving as a target object is loaded into the chamber 1 to be mounted on the supporting table 2, and the supporting table 2 is moved up to a position as illustrated in the drawing. Then, the inside of the chamber 1 is exhausted to a preset pressure by the vacuum pump of the exhaust system 12 via the exhaust port 11, and a plasma process is performed (process S102). By way of example, the process controller 50 performs the plasma process on a surface of a photoresist with plasma generated from a hydrogen-containing gas. To be more specific, the process controller 50 supplies the hydrogen-containing gas to the chamber 1 from the processing gas supply system 23 and processes a surface of the target object with the plasma generated from the hydrogen-containing gas.

Then, an etching process is performed (process S103). By way of example, the process controller 50 etches a silicon-containing film with plasma generated from a CF-based gas and a gas containing a CHF-based gas by using the plasma-processed photoresist as a mask. To be more specific, the process controller 50 supplies the CF-based gas and the gas containing the CHF-based gas to the chamber 1 from the processing gas supply system 23 and etches the silicon-containing film with the plasma generated from the CF-based gas and the gas containing the CHF-based gas.

Herein, the plasma process can also be referred to as "cure process". Through the plasma process, a SWR (Side Wall Roughness) or a LER (Line Edge Roughness) of the photoresist used as a mask can be improved.

Figure 6:
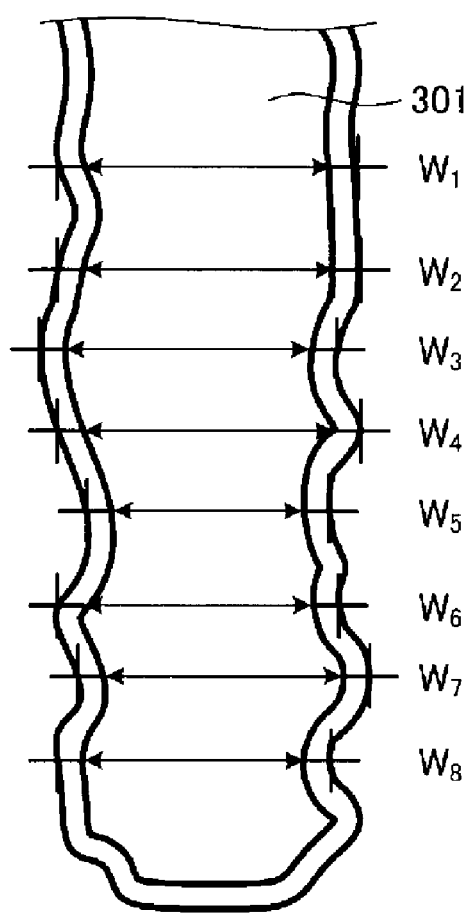
FIG. 6 is a diagram illustrating a SWR.

FIG. 6 is a diagram illustrating a SWR. Reference numeral 301 in FIG. 6 denotes the photoresist as viewed from the top. A SWR refers to non-uniformity of line widths of the photoresist. By way of example, the SWR is obtained by measuring line widths $W_l$ of multiple positions as depicted in FIG. 6 and calculating the non-uniformity thereof. In the example depicted in FIG. 6, the SWR is obtained by measuring each of line widths $W_1$ to $W_8$ and calculating the non-uniformity of the measured line widths $W_1$ to $W_8$. A value of the non-uniformity is a value of the SWR determined as $3\sigma$ which is a value three times the standard deviation ($\sigma$) of the measured line widths $W_1$ to $W_8$.

Figure 7:
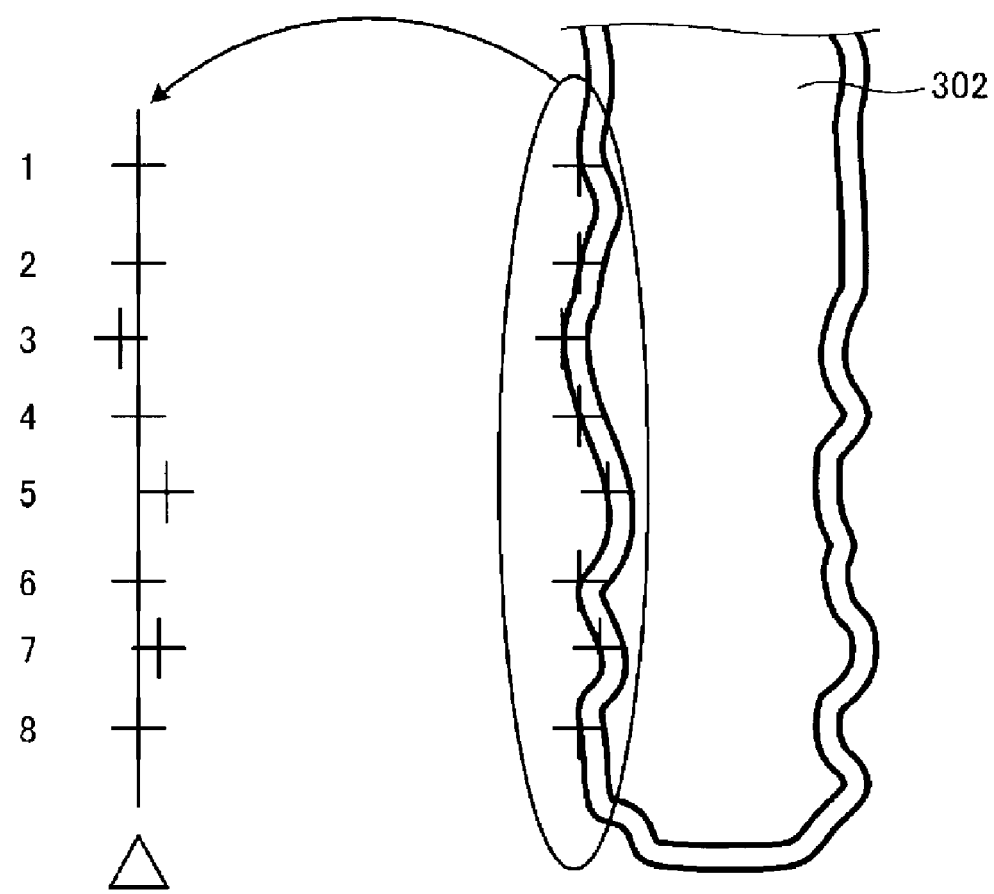
FIG. 7 is a diagram illustrating a LER.

FIG. 7 is diagram illustrating a LER. Reference numeral 302 in FIG. 7 denotes the photoresist as viewed from the top. A LER refers to non-uniformity of edges. By way of example, the LER is obtained by measuring edge positions of multiple sections as depicted in FIG. 7 and calculating the non-uniformity of the measured positions. By way of example, in the example depicted in FIG. 7, the LER is obtained by measuring positions 1 to 8 and calculating the non-uniformity from the average of the edge positions. Hereinafter, one of two edges of a line will be described as a LER (R), and the other will be described as a LER (L). Further, in the following explanation, "SUM", which is the sum value of the SWR, the LER (R), and the LER (L), is used together as appropriate. Further, a high value of each of the SWR, the LER (R), the LER (L), and the SUM indicates a high non-uniformity, and a low value thereof indicates a low non-uniformity. Values of the non-uniformity are values of the LER (R) and the LER (L) determined as $3\sigma$ which is a value three times the standard deviation (σ) of differences between each of the edge positions of the measured positions 1 to 8 and the average thereof.

Figure 9:
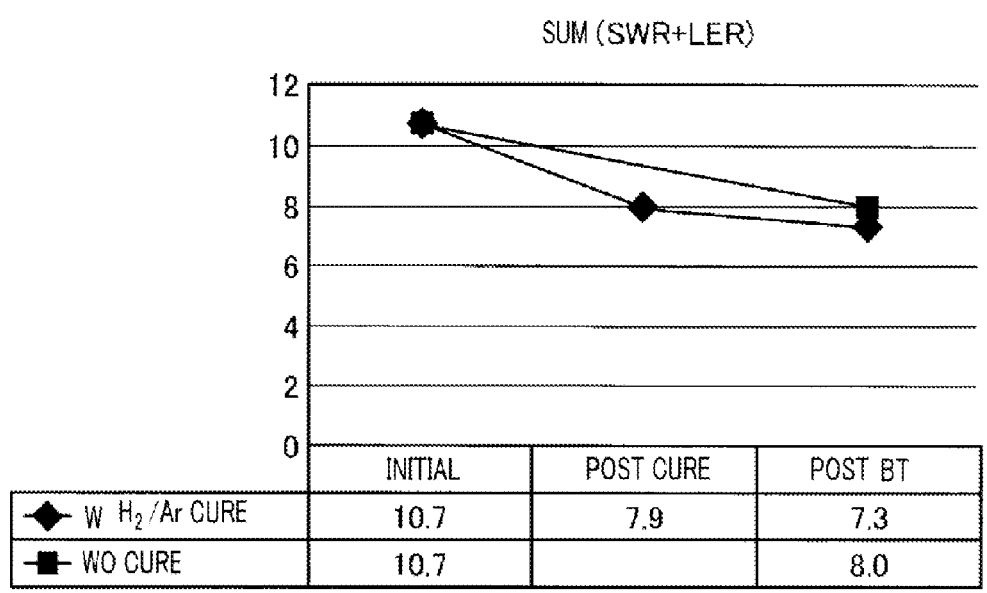
FIG. 9 is a diagram illustrating a difference between a case where etching is performed after a plasma process in accordance with the first example embodiment and a case where etching is performed without performing a plasma process.

FIG. 8 and FIG. 9 are diagrams each illustrating a difference between a case where the etching process is performed after the plasma process in accordance with the first example embodiment and a case where the etching process is performed without performing the plasma process. In FIG. 8, "INITIAL" denotes a target object prior to the process, "POST CURE" denotes the target object after the plasma process is performed once, "POST BREAKTHROUGH" denotes the target object in a case where a breakthrough process is carried out after the plasma process is performed once, and "WO CURE" denotes the target object in a case where the breakthrough process is carried out without the plasma process. Further, the breakthrough process indicates a case where the etching process is performed on the SiON 205 of the target object depicted in FIG. 4 so that the SOH 204 is exposed. Further, in the drawing, "CROSS SECTION" and "TOP SURFACE" of the target object are trace drawings which trace photos of the cross section and the top surface of the target object at a magnification of 150,000 times.

FIG. 8 and FIG. 9 show the values of the SWR, the LER (R), and the LER (L) together with the "SUM", which is the sum value of the SWR, the LER (R), and the LER (L). Further, FIG. 8 and FIG. 9 show "MASK HEIGHT" that indicates a height of the photoresist and "TOP/BTM CD" that shows CD (Critical Dimension) of a top portion and a bottom portion thereof.

Further, FIG. 8 and FIG. 9 show a result of a case where the plasma process is performed by using a hydrogen-containing gas including $H_2$ of 100 sccm and an Ar gas of 800 sccm at the target object temperature of 30 degrees and the pressure of 2.67 Pa (20 mT) for 15 seconds. Further, in the example depicted in FIG. 8, there is shown a result of a case where the etching process is performed by using a gas including a $CF_4$ gas of 80 sccm and a $CHF_3$ gas of 50 sccm at the target object temperature of 7 degrees and the pressure of 2.00 Pa (15 mT) for 30 seconds.

As depicted in FIG. 8 and FIG. 9, since the plasma process is performed, the SWR, the LER (R), the LER (L), and the SUM after the plasma process become smaller than the SWR, the LER (R), the LER (L), and the SUM before the plasma process. Further, as a result, in a case where the breakthrough process is performed after the plasma process, the SWR, the LER (R), the LER (L), and the SUM become smaller than the SWR, the LER (R), the LER (L), and the SUM in a case where a breakthrough process is performed without performing the plasma process.

As such, since the etching process is performed after the plasma process, a roughness of the photoresist can be improved. In other words, the SiON can be etched while maintaining the photoresist, so that the LER or the like can be improved. Further, even if the etching process is further performed, if the etching process is performed after the plasma process, a roughness of the etching shape is reduced, so that the clean etching process can be performed as compared with the case where the plasma process is not performed.

Returning to the explanation of the plasma process, the plasma process is performed by using a gas containing at least one of a $H_2$ gas, a $H_2/Ar$ gas, a HBr gas, a $H_2/N_2$ gas, a $N_2$ gas, and a $H_2/N_2/CH_4$ gas as the hydrogen-containing gas. Desirably, the plasma process is performed by using a $H_2/Ar$ gas, a $H_2/N_2$ gas, a $H_2/N_2/CH_4$ gas, and a $N_2$ gas as the hydrogen-containing gas. More desirably, the plasma process is performed by using a $H_2/Ar$ gas and a $H_2/N_2/CH_4$ gas as the hydrogen-containing gas.

Figure 11:
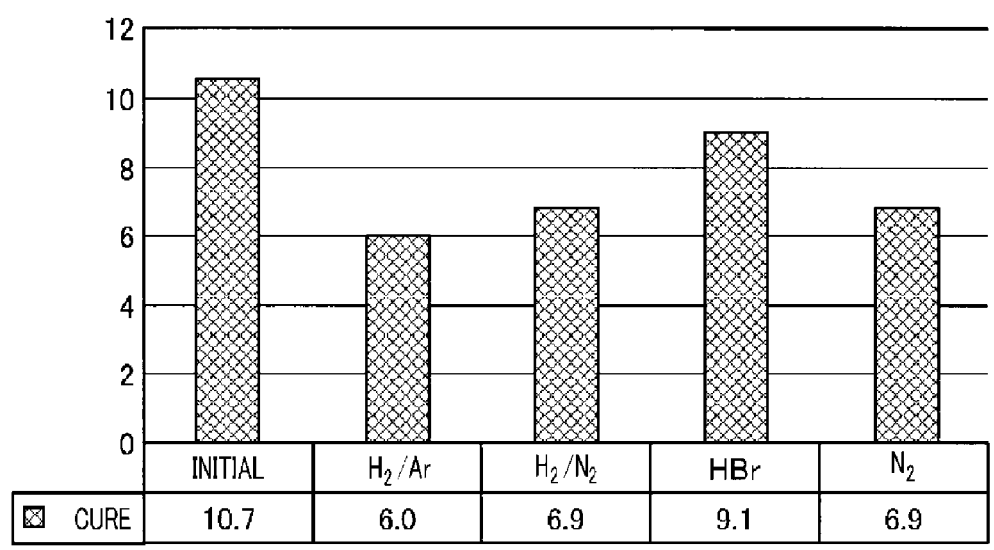
FIG. 11 is a diagram illustrating an effect depending on a kind of a hydrogen-containing gas used in a plasma process in accordance with the first example embodiment.

FIG. 10 and FIG. 11 are diagrams each illustrating an effect depending on a kind of the hydrogen-containing gas used in the plasma process in accordance with the first example embodiment. In the example depicted in FIG. 10, the $H_2/Ar$ gas, the $H_2/N_2$ gas, the HBr gas, and the $N_2$ gas are used as the hydrogen-containing gas.

FIG. 10 and FIG. 11, when using the $H_2/Ar$ gas, the plasma process is performed by using a hydrogen-containing gas including a $H_2$ gas of 100 sccm and an Ar gas of 800 sccm. Further, when using the $H_2/N_2$ gas, the plasma process is performed by using a hydrogen-containing gas including a $H_2$ gas of 170 sccm and a $N_2$ gas of 250 sccm. Moreover, when using a HBr gas, the plasma process is performed by using a HBr gas of 100 sccm. Furthermore, when using a $N_2$ gas, the plasma process is performed by using a $N_2$ gas of 200 sccm. Further, as other processing conditions, the plasma process is performed at a target object temperature of 30 degrees and a pressure of 4.0 Pa (30 mT) for 30 seconds.

As shown in FIG. 10 and FIG. 11, by using the $H_2/Ar$ gas, the $H_2/N_2$ gas, and the $N_2$ gas, it is possible to obtain desirable SWR, LER (R), LER (L), and SUM as compared with the case of using the HBr. Further, by using the $H_2/Ar$ gas, it is possible to obtain desirable SWR, LER (R), LER (L), and SUM while maintaining a height of the photoresist as compared with the case of using the $H_2/N_2$ gas, and it is also possible to obtain desirable SWR, LER (R), LER (L), and SUM as compared with the case of using the $N_2$ gas.

As such, it is possible to further improve a roughness of the photoresist by selecting a hydrogen-containing gas. In other words, the SiON can be etched while maintaining the photoresist, so that the LER or the like can be improved. As a result, even if the etching process is further performed, if the etching process is performed after the plasma process, the roughness of the etching shape is reduced, so that the clean etching process can be performed as compared with the case where the plasma process is not performed.

In the etching process, for example, a $CF_4$ gas is used as the CF-based gas, and a $CHF_3$ gas is used as the gas containing the CHF-based gas.

Returning to the explanation of the plasma process, desirably, the plasma process is performed at a pressure lower than the etching process. By way of example, the plasma process is performed at, desirably, less than 6.67 Pa (50 mT), more desirably, 2.67 Pa (20 mT) or less, still more desirably, 1.33 Pa (10 mT).

Further, desirably, the plasma process is performed at a higher temperature of the target object than the etching process. By way of example, the plasma process is performed at a higher temperature than a target object temperature of 20 degrees, desirably, 40 degrees or higher, more desirably, 50 degrees or higher.

Figure 12:
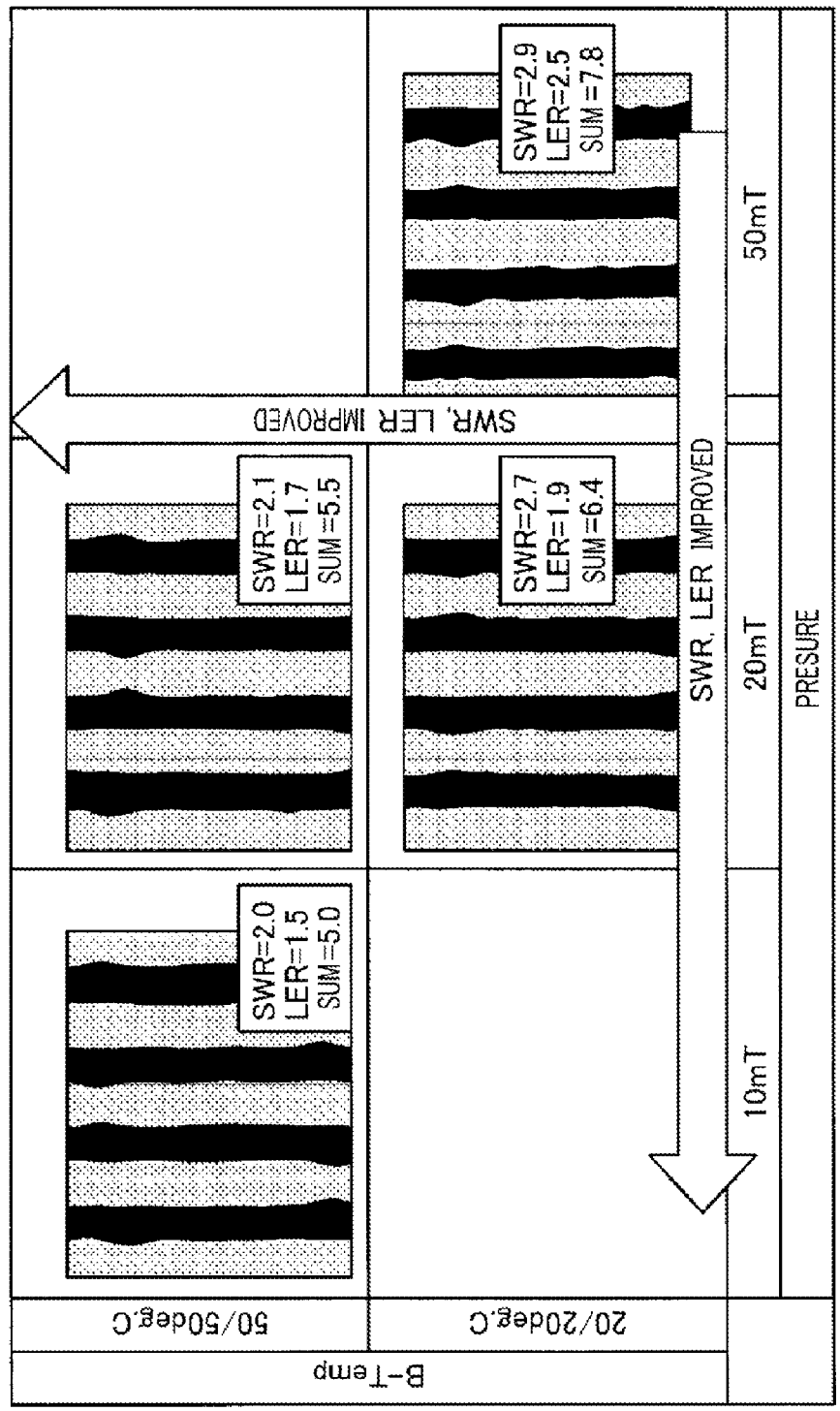
FIG. 12 is a diagram illustrating a relationship between a pressure and a temperature of the target object in accordance with the first example embodiment.

FIG. 12 is a diagram illustrating a relationship between a pressure and a temperature of the target object in accordance with the first example embodiment. In the example depicted in FIG. 12, there is shown a result of a case where the plasma process is performed by using a hydrogen-containing gas including a $H_2$ gas of 240 sccm, a $N_2$ gas of 60 sccm, and a $CH_4$ gas of 10 sccm for 30 seconds.

As depicted in FIG. 12, the SWR, the LER, and the SUM are decreased as a temperature of the target object is increased from 20 degrees to 50 degrees. Further, the SWR, the LER, and the SUM are decreased as a pressure is decreased from 6.67 Pa (50 mT) to 2.67 Pa (20 mT) and 1.33 Pa (10 mT). In other words, in a case where a temperature of the target object is high, a desirable result is obtained as compared with a case where a temperature of the target object is low, and in a case where a pressure is low, a desirable result is obtained as compared with a case where a pressure is high. Further, in the example depicted in FIG. 12, the most desirable result is obtained in a case where a pressure is 1.33 Pa (10 mT) and a temperature of the target object is 50 degrees.

As such, since the plasma process is performed at a higher temperature of the target object and a lower pressure as compared with, for example, the etching process, the roughness of the photoresist can be further improved. In other words, the SiON can be etched while maintaining the photoresist, so that the LER or the like can be improved. As a result, even if the etching process is further performed, if the etching process is performed after the plasma process, it is possible to perform the clean etching process as compared with the case where the plasma process is not performed.

Further, in the plasma etching method, the plasma process and the etching process are repeated at least two or more times. Herein, desirably, a processing time of a first plasma process is longer than a processing time of a second or later plasma process, and the plasma process and the etching process are performed for preset times, respectively.

By way of example, a processing time of the first plasma process is desirably longer than 15 seconds and shorter than 45 seconds, and, more desirably 30 seconds. This is because even if a processing time of the first plasma process is further lengthened, there is a limit in improving the roughness of the photoresist.

Further, by way of example, desirably, each plasma process is performed for longer than 6 seconds and each etching process is performed for longer than 5 seconds. This is because if a processing time of each process is shorter than a time during which the plasma is stabilized, even if the number of repetition times is increased, the roughness of the etching shape such as the SUM or the like may not be improved.

Figure 14:
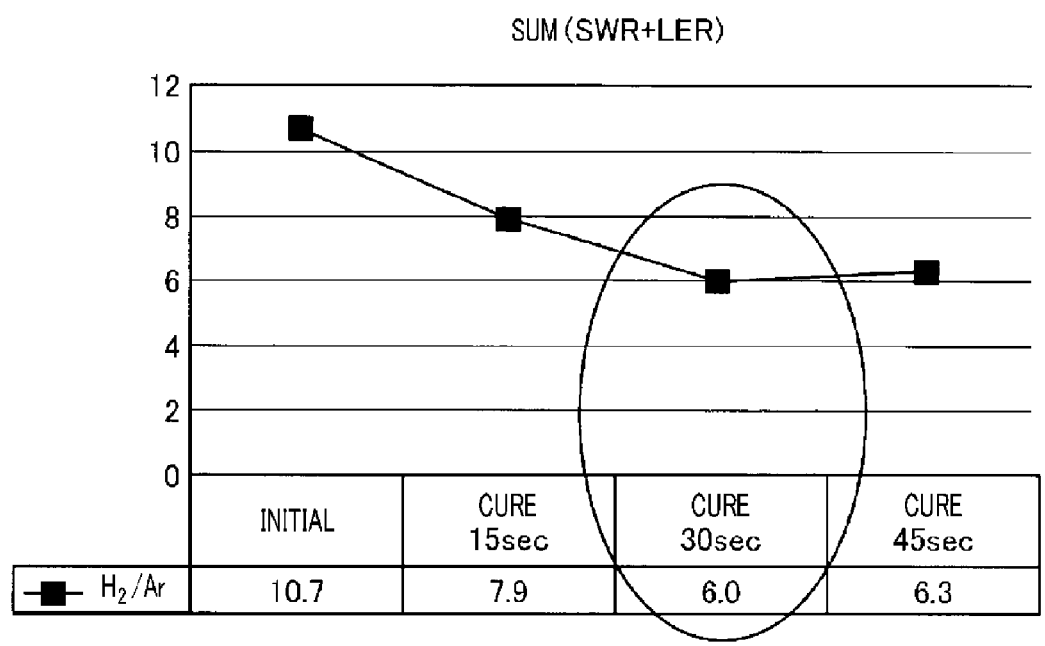
FIG. 14 is a diagram illustrating a relationship between a time of performing a plasma process and a roughness of a photoresist in accordance with the first example embodiment.

FIG. 13 and FIG. 14 are diagrams each illustrating a relationship between a time period for performing the plasma process and the roughness of a photoresist in accordance with the first example embodiment. FIG. 13 and FIG. 14 show a result of a case where the plasma process is performed by using a hydrogen-containing gas including a $H_2$ gas of 100 sccm and an Ar gas of 800 sccm at a target object temperature of 30 degrees and a pressure of 2.67 Pa (20 mT).

As shown in FIG. 13 and FIG. 14, the SUM in a case where the plasma process is performed to the target object for 30 seconds is decreased as compared with a case where the plasma process is performed to the target object for 15 seconds. Meanwhile, the SUM in a case where the plasma process is performed to the target object for 45 seconds is increased as compared with the case where the plasma process is performed to the target object for 30 seconds. That is, even if the plasma process is performed for 30 seconds or longer, the SUM may not be improved and a desirable result is obtained in a case where the plasma process is performed to the target object for about 30 seconds.

Figure 16:
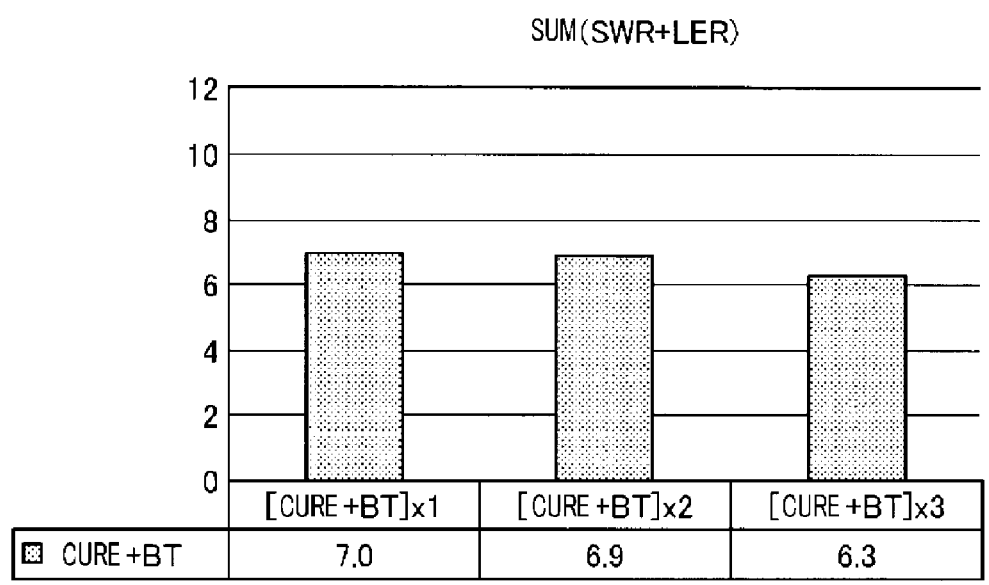
FIG. 16 is a diagram illustrating a case where a plasma process and an etching process are repeated two or more times in accordance with the first example embodiment.

FIG. 15 and FIG. 16 are diagrams each illustrating a case where the plasma process and the etching process are repeated two or more times in accordance with the first example embodiment. FIG. 15 and FIG. 16 show a result of a case where the plasma process is performed by using a hydrogen-containing gas including a $H_2$ gas of 100 sccm and an Ar gas of 800 sccm at a target object temperature of 30 degrees and a pressure of 2.67 Pa (20 mT). Further, FIG. 15 and FIG. 16 show a result of a case where the etching process is performed by using a gas including a $CF_4$ gas of 80 sccm and a $CHF_3$ gas of 50 sccm at a target object temperature of 7 degrees and a pressure of 2.00 Pa (15 mT). Furthermore, in the example depicted in FIG. 15 and FIG. 16, "[CURE+BT]×1" denotes a result in a case where the etching process is performed for 30 seconds after performing the plasma process for 30 seconds. "[CURE+BT]×2" denotes a result in a case where the plasma process is performed for 30 seconds, the etching process is performed for 15 seconds, the plasma process is performed for 30 seconds, and then, the etching process is performed for 15 seconds in sequence. "[CURE+BT]×3" denotes a result in a case where the plasma process is performed for 30 seconds, the etching process is performed for 10 seconds, the plasma process is performed for 15 seconds, the etching process is performed for 10 seconds, the plasma process is performed for 15 seconds, and then, the etching process is performed for 10 seconds in sequence.

Figure 18:
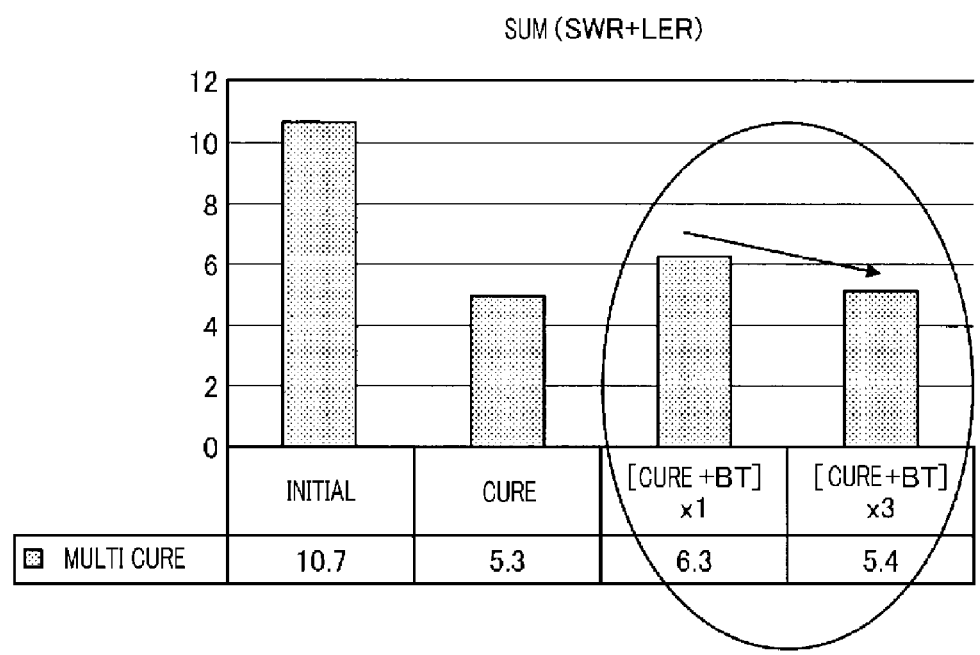
FIG. 18 is a diagram illustrating a case where a plasma process and an etching process are repeated two or more times in accordance with the first example embodiment.

FIG. 17 and FIG. 18 are diagrams each illustrating a case where the plasma process and the etching process are repeated two or more times in accordance with the first example embodiment. FIG. 17 and FIG. 18 show a result of a case where the plasma process is performed by using a hydrogen-containing gas including a $H_2$ gas of 240 sccm, a $N_2$ gas of 60 sccm, a $CH_4$ gas of 10 sccm at a target object temperature of 20 degrees and a pressure of 6.67 Pa (50 mT). Further, FIG. 17 and FIG. 18 show a result of a case where the etching process is performed by using a gas including a $CF_4$ gas of 130 sccm and a $CHF_3$ gas of 70 sccm at a target object temperature of 20 degrees and a pressure of 8.00 Pa (60 mT). Furthermore, in the example depicted in FIG. 17 and FIG. 18, "[CURE]" denotes a result in a case where the plasma process is performed for 30 seconds. "[CURE+BT]×1" denotes a result in a case where the plasma process is performed for 30 seconds, and then, the etching process is performed for 60 seconds in sequence. "[CURE+BT]×3" denotes a result in a case where the plasma process is performed for 30 seconds, the etching process is performed for 20 seconds, the plasma process is performed for 15 seconds, the etching process is performed for 20 seconds, the plasma process is performed for 15 seconds, and then, the etching process is performed for 20 seconds in sequence.

Figure 20:
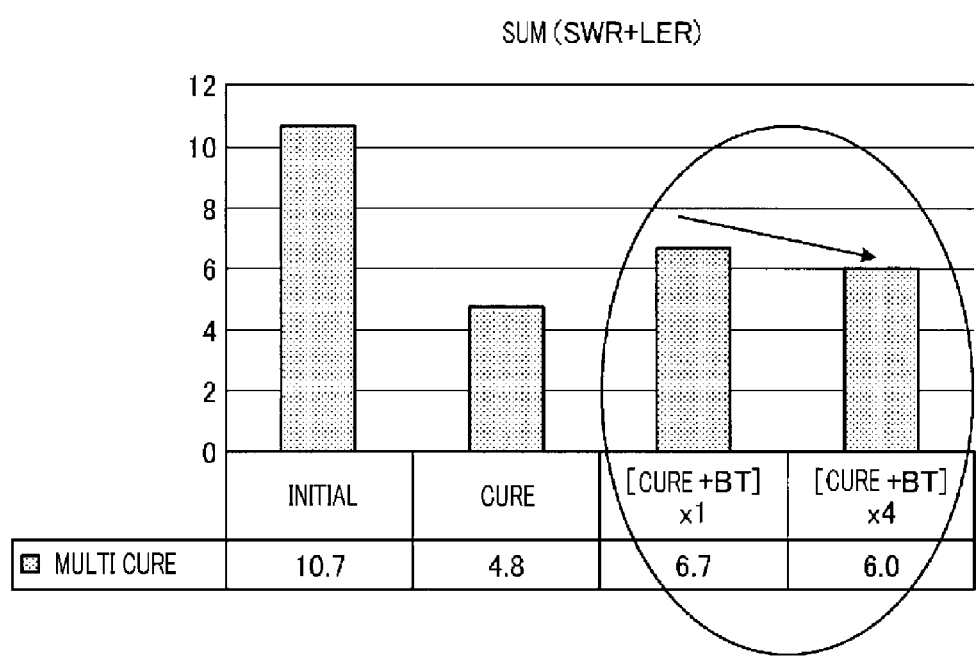
FIG. 20 is a diagram illustrating a case where a plasma process and an etching process are repeated two or more times in accordance with the first example embodiment.

FIG. 19 and FIG. 20 are diagrams each illustrating a case where the plasma process and the etching process are repeated two or more times in accordance with the first example embodiment. FIG. 19 and FIG. 20 show a result of a case where the plasma process is performed by using a hydrogen-containing gas including a $H_2$ gas of 120 sccm, a $N_2$ gas of 180 sccm, a $CH_4$ gas of 10 sccm at a target object temperature of 20 degrees and a pressure of 5.33 Pa (40 mT). Further, FIG. 19 and FIG. 20 show a result of a case where the etching process is performed by using a gas including a $CF_4$ gas of 110 sccm, a $CHF_3$ gas of 90 sccm, and an $O_2$ gas of 15 sccm at a target object temperature of 20 degrees and a pressure of 9.33 Pa (70 mT). Furthermore, in the example depicted in FIG. 19 and FIG. 20, "[CURE]" denotes a result in a case where the plasma process is performed for 30 seconds. "[CURE+BT]×1" denotes a result in a case where the plasma process is performed for 30 seconds, and then, the etching process is performed for 56 seconds in sequence. "[CURE+BT]×4" denotes a result in a case where the plasma process is performed for 30 seconds, the etching process is performed for 10 seconds, the plasma process is performed for 8 seconds, the etching process is performed for 10 seconds, the plasma process is performed for 8 seconds, the etching process is performed for 10 seconds, the plasma process is performed for 8 seconds, and then, the etching process is performed for 28 seconds in sequence. Further, "[CURE+BT]×1" and "[CURE+BT]×4" show a result in a case where the last etching process is performed by using a gas including a $CF_4$ gas of 110 sccm, a $CHF_3$ gas of 90 sccm, and an $O_2$ gas of 5 sccm at a target object temperature of 20 degrees and a pressure of 6.67 Pa (50 mT).

As shown in FIG. 13 to FIG. 20, the SUM is improved by repeating the plasma process and the etching process two or more times.

Figure 22:
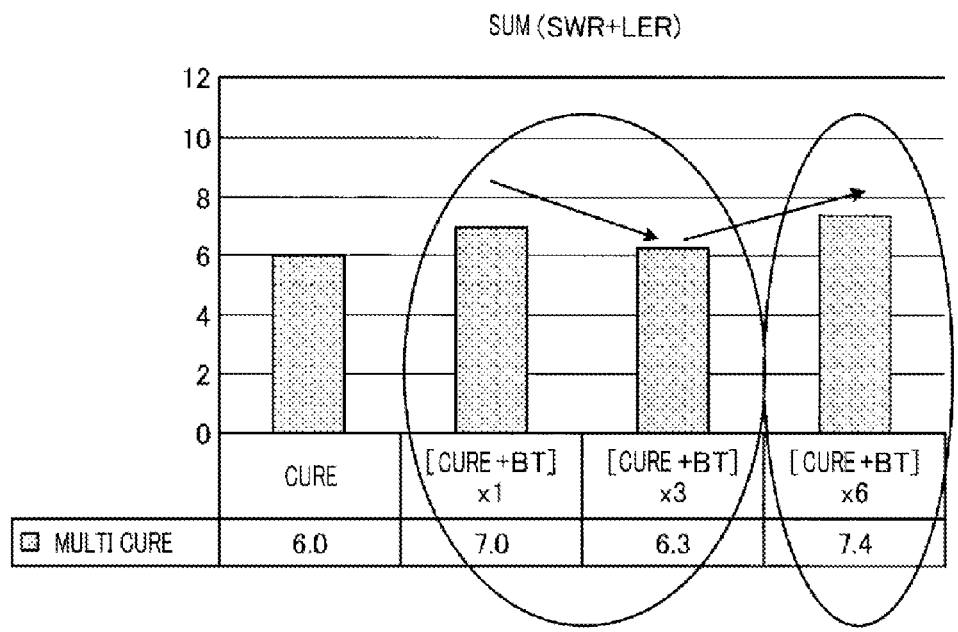
FIG. 22 is a diagram illustrating a case where a plasma process and an etching process are repeated two or more times in accordance with the first example embodiment.

FIG. 21 and FIG. 22 are diagrams each illustrating a case where the plasma process and the etching process are repeated two or more times in accordance with the first example embodiment. FIG. 21 and FIG. 22 show a result of a case where the plasma process is performed by using a hydrogen-containing gas including a $H_2$ gas of 100 sccm and an Ar gas of 800 sccm at a target object temperature of 30 degrees and a pressure of 2.67 Pa (20 mT). Further, FIG. 21 and FIG. 22 show a result of a case where the etching process is performed by using a gas including a $CF_4$ gas of 80 sccm and a $CHF_3$ gas of 50 sccm at a target object temperature of 7 degrees and a pressure of 2.00 Pa (15 mT). Furthermore, in the example depicted in FIG. 21 and FIG. 22, "[CURE]" denotes a result in a case where the plasma process is performed for 30 seconds. "[CURE+BT]×1" denotes a result in a case where the plasma process is performed for 30 seconds, and then, the etching process is performed for 30 seconds in sequence. "[CURE+BT]×3" denotes a result in a case where the plasma process is performed for 30 seconds, the etching process is performed for 10 seconds, the plasma process is performed for 15 seconds, the etching process is performed for 10 seconds, the plasma process is performed for 15 seconds, and then, the etching process is performed for 10 seconds in sequence. "[CURE+BT]×6" denotes a result in a case where the plasma process is performed for 30 seconds, the etching process is performed for 5 seconds, the plasma process is performed for 6 seconds, the etching process is performed for 5 seconds, the plasma process is performed for 6 seconds, the etching process is performed for 5 seconds, the plasma process is performed for 6 seconds, the etching process is performed for 5 seconds, the plasma process is performed for 6 seconds, the etching process is performed for 5 seconds, the plasma process is performed for 6 seconds, and then, the etching process is performed for 5 seconds in sequence.

As shown in FIG. 21 and FIG. 22, the SUM of "[CURE+BT]×6" is higher than the SUM of "[CURE+BT]×3". This may be because a processing time of each plasma process or each etching process is decreased, so that plasma is not stabilized. That is, by performing each plasma process and each etching process for the preset time or longer, the SUM can be improved.

Herein, the hydrogen-containing gas used in the plasma process will be further explained. The hydrogen-containing gas contains at least one of a $H_2$ gas, a $H_2/Ar$ gas, a HBr gas, a $H_2/N_2$ gas, a $N_2$ gas, and a $H_2/N_2/CH_4$ gas. The hydrogen-containing gas desirably contains a $H_2/Ar$ gas, a $H_2/N_2$ gas, and a $H_2/N_2/CH_4$ gas, and more desirably contains a $H_2/Ar$ gas and a $H_2/N_2/CH_4$ gas.

Figure 23:
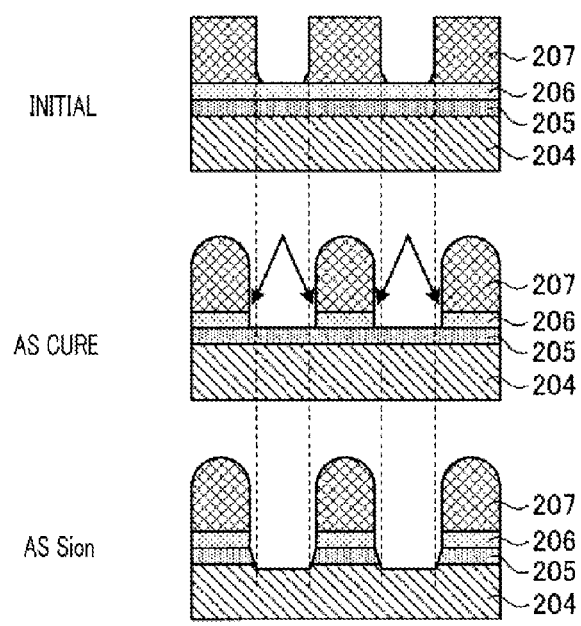
FIG. 23 is a diagram illustrating an example of a change in the target object in a case where a $H_2/N_2$ gas is used in the plasma process in accordance with the first example embodiment.
Figure 24:
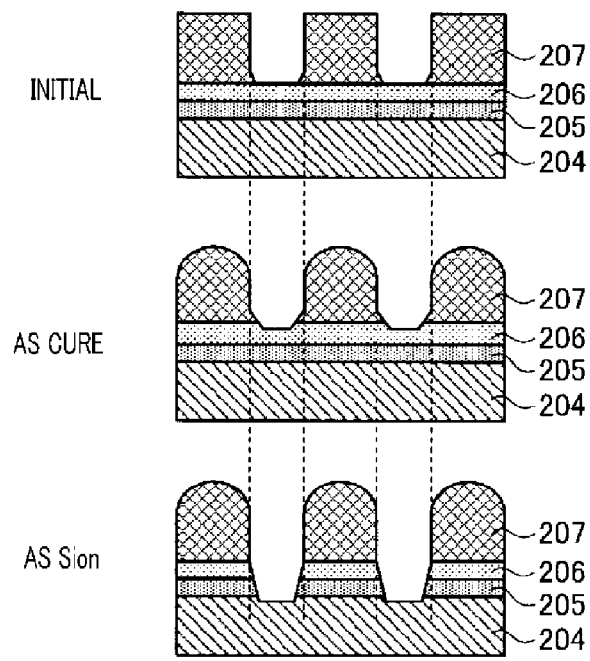
FIG. 24 is a diagram illustrating an example of a change in the target object in a case where a $H_2/N_2/CH_2F_2$ gas, a $H_2/N_2/CHF_3$ gas, or a HBr gas is used in the plasma process in accordance with the first example embodiment.
Figure 25:
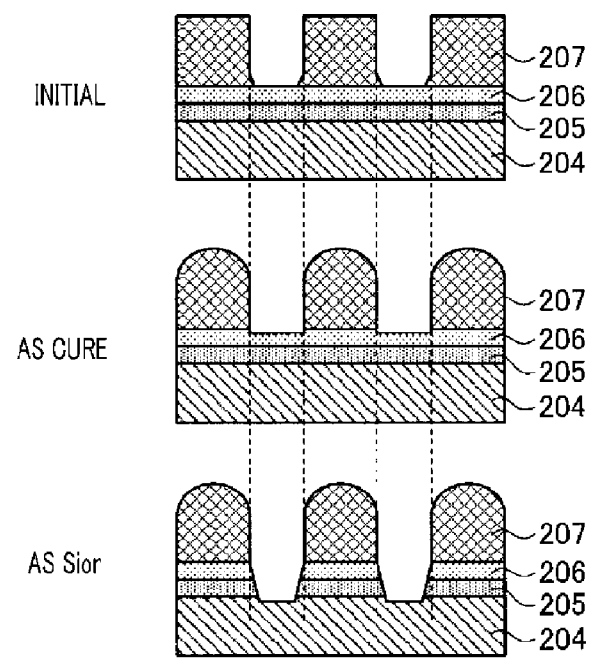
FIG. 25 is a diagram illustrating an example of a change in the target object in a case where a $H_2/N_2/CH_4$ gas is used in the plasma process in accordance with the first example embodiment.

FIG. 23 is a diagram illustrating an example of a change in the target object when using a $H_2/N_2$ gas in the plasma process in accordance with the first example embodiment. FIG. 24 is a diagram illustrating an example of a change in the target object when using a $H_2/N_2/CH_2F_2$ gas, a $H_2/N_2/CHF_3$ gas, or a HBr gas in the plasma process in accordance with the first example embodiment. FIG. 25 is a diagram illustrating an example of a change in the target object when using a $H_2/N_2/CH_4$ gas in the plasma process in accordance with the first example embodiment. In the examples depicted in FIG. 23 to FIG. 25, an example of the target object before the plasma process is described as "INITIAL", an example of the target object after the plasma process and before the etching process is described as "AS CURE", and an example of the target object after the etching process is described as "AS Sion". In the examples depicted in FIG. 23 to FIG. 25, in the target object, for example, the SOH layer 204, the SiON layer 205, and the BARC layer 206 are stacked in sequence, and the photoresist layer 207 having a preset pattern is formed on the BARC layer 206.

As depicted in FIG. 23, when using a $H_2/N_2$ gas as the hydrogen-containing gas, the BARC layer 206 is removed in the plasma process. Further, when using the $H_2/N_2$ gas as the hydrogen-containing gas, as shown in FIG. 23 in which there is no residual of the hydrogen-containing gas at places indicated by arrows, a scum removing effect can be increased as compared with the case of using the $H_2/N_2/CH_2F_2$ gas, the $H_2/N_2/CHF_3$ gas, or the HBr gas. Herein, a scum refers to a residual of the photoresist layer 207.

Further, as depicted in FIG. 24, when using a $H_2/N_2/CH_2F_2$ gas, a $H_2/N_2/CHF_3$ gas, or a HBr gas as the hydrogen-containing gas, the BARC layer is not removed in the plasma process. As a result, the BARC layer and the SiON layer are etched in the subsequent process. Furthermore, when using a $H_2/N_2/CH_2F_2$ gas, a $H_2/N_2/CHF_3$ gas, or a HBr gas as the hydrogen-containing gas, it is possible to suppress an increase in the CD (Critical Dimension) as compared with the case of using a $H_2/N_2$ gas as the hydrogen-containing gas. Moreover, when using a $H_2/N_2/CH_2F_2$ gas, a $H_2/N_2/CHF_3$ gas, or a HBr gas as the hydrogen-containing gas, it is possible to increase the selectivity of the photoresist as compared with the case of using a $H_2/N_2$ gas as the hydrogen-containing gas.

Further, as depicted in FIG. 25, when using a $H_2/N_2/CH_4$ gas as the hydrogen-containing gas, the BARC layer is not removed in the plasma process. As a result, the BARC layer and the SiON layer are etched in the subsequent process. Furthermore, when using a $H_2/N_2/CH_4$ gas as the hydrogen-containing gas, the scum removing effect can be improved as compared with the case of using a $H_2/N_2/CH_2F_2$ gas, a $H_2/N_2/CHF_3$ gas, or a HBr gas. Moreover, when using a $H_2/N_2/CH_4$ gas as the hydrogen-containing gas, it is possible to increase the selectivity of the photoresist as compared with the case of using a $H_2/N_2$ gas as the hydrogen-containing gas, so that it is possible to suppress an increase in CD (Critical Dimension). That is, by comparison between FIG. 23 and FIG. 25, by using the $CH_4$ gas, it is possible to achieve a high scum removing effect while maintaining the selectivity of the photoresist. Further, as a result, the high scum removing effect is compatible with suppression of the increase in CD (shrink effect).

EXPLANATION OF REFERENCE NUMERALS

1: Chamber
2: Supporting table
3: Insulating plate
4: Supporting member
11: Exhaust port
12: Exhaust system
18: Gas introduction device
23: Processing gas supply system
50: Process controller
100: Plasma etching apparatus

We claim:
1. A plasma etching method comprising:
a plasma process of plasma-processing a surface of a photoresist, which has a predetermined pattern and is formed on a target object, with plasma generated from a hydrogen-containing gas; and an etching process of etching a silicon-containing film with plasma generated from a CF-based gas and a gas containing a CHF-based gas by using the plasma-processed photoresist as a mask, wherein each of the plasma process and the etching process is repeated at least two or more times.

2. The plasma etching method of claim 1,
wherein
a processing time of the plasma process performed for a first time is longer than a processing time of the plasma process performed for a second time or later.

3. The plasma etching method of claim 1,
wherein the hydrogen-containing gas contains at least one of a $H_2$ gas, a $H_2$/Ar gas, a HBr gas, a $H_2/N_2$ gas, a $N_2$ gas, and a $H_2/N_2/CH_4$ gas.

4. The plasma etching method of claim 1,
wherein the CF-based gas is a $CF_4$ gas and the gas containing the CHF-based gas is a $CHF_3$ gas.

5. The plasma etching method of claim 1,
wherein each of the plasma process and the etching process is performed for a predetermined time or more.

6. The plasma etching method of claim 1,
wherein the plasma process is performed at a lower pressure than the etching process.

7. The plasma etching method of claim 1,
wherein a temperature of the target object in the plasma process is higher than a temperature of the target object in the etching process.

8. A plasma etching apparatus comprising:

a chamber configured to perform a plasma etching process to a target object;

an exhaust unit configured to decompress an inside of the chamber;

a gas supply unit configured to supply a processing gas into the chamber; and a control unit configured to control such that a surface of a photoresist formed on the target object is plasma-processed with plasma generated from a hydrogen-containing gas in a plasma process, and then a silicon-containing film on the target object is etched with a CF-based gas and a gas containing a CHF-based gas by using the plasma-processed photoresist as a mask in an etching process, wherein the control unit is configured to control that each of the plasma process and the etching process is repeated at least two or more times.

* * * * *